(12) United States Patent
Kizu et al.

(10) Patent No.: US 9,923,164 B2
(45) Date of Patent: Mar. 20, 2018

(54) METHOD FOR MANUFACTURING TRANSPARENT ELECTRODE, TRANSPARENT ELECTRODE, AND ORGANIC ELECTROLUMINESCENCE DEVICE PROVIDED WITH THE SAME

(71) Applicant: TOPPAN PRINTING CO., LTD., Taito-ku (JP)

(72) Inventors: Takashi Kizu, Taito-ku (JP); Hirokazu Masuoka, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 15/017,091

(22) Filed: Feb. 5, 2016

(65) Prior Publication Data

US 2016/0164022 A1    Jun. 9, 2016

Related U.S. Application Data

(63) Continuation of application No. PCT/JP2014/003956, filed on Jul. 28, 2014.

(30) Foreign Application Priority Data

Aug. 19, 2013  (JP) ................................ 2013-169751

(51) Int. Cl.
*H01L 51/52*  (2006.01)
*H01L 51/44*  (2006.01)
(Continued)

(52) U.S. Cl.
CPC .. *H01L 51/5212* (2013.01); *H01L 31/022466* (2013.01); *H01L 51/445* (2013.01);
(Continued)

(58) Field of Classification Search
CPC ............ H01L 51/5212; H01L 51/5215; H01L 51/445
See application file for complete search history.

(56) References Cited

U.S. PATENT DOCUMENTS

2004/0113146 A1* 6/2004 Dahmani ............ C03C 17/3417
257/40
2006/0061270 A1  3/2006 Uhlig et al.
(Continued)

FOREIGN PATENT DOCUMENTS

CN      101512682 A    8/2009
CN      101926019 A    12/2010
(Continued)

OTHER PUBLICATIONS

International Search Report dated Oct. 28, 2014 in PCT/JP2014/003956, filed Jul. 28, 2014.
(Continued)

*Primary Examiner* — Michele Fan
(74) *Attorney, Agent, or Firm* — Oblon, McClelland, Maier & Neustadt, L.L.P.

(57) ABSTRACT

A transparent electrode includes a transparent substrate, a thin wire structure partially covering a surface of the transparent substrate and formed of a conductive material, and a transparent conductive layer formed on the transparent substrate to cover the thin wire structure. The transparent conductive layer is formed of two or more separately prepared layers.

10 Claims, 4 Drawing Sheets

(51) Int. Cl.
*H01L 31/0224* (2006.01)
*H05K 1/02* (2006.01)

(52) U.S. Cl.
CPC ....... *H01L 51/5215* (2013.01); *H05K 1/0274* (2013.01); *Y02E 10/549* (2013.01); *Y02P 70/521* (2015.11)

(56) References Cited

U.S. PATENT DOCUMENTS

| | | | |
|---|---|---|---|
| 2009/0295285 A1 | 12/2009 | Tokunaga et al. | |
| 2011/0001153 A1 | 1/2011 | Tchakarov et al. | |
| 2011/0001420 A1* | 1/2011 | Tchakarov | H01L 51/5212 313/355 |
| 2013/0004753 A1* | 1/2013 | Majumdar | H01L 51/0024 428/209 |
| 2013/0052905 A1 | 2/2013 | Kaiho | |
| 2013/0334506 A1* | 12/2013 | Tobise | H01L 51/5268 257/40 |
| 2015/0041787 A1* | 2/2015 | Malik | H01L 51/445 257/40 |

FOREIGN PATENT DOCUMENTS

| | | |
|---|---|---|
| JP | 10-162961 | 6/1998 |
| JP | 2005-302508 A | 10/2005 |
| JP | 2006-093123 | 4/2006 |
| JP | 2008-28028 A | 2/2008 |
| JP | 2008-243567 A | 10/2008 |
| JP | 2011-504639 A | 2/2011 |
| JP | 2011-216251 A | 10/2011 |
| WO | WO 2008/038764 A1 | 4/2008 |
| WO | WO 2010/050318 A1 | 5/2010 |

OTHER PUBLICATIONS

Combined Office Action and Search Report dated Nov. 30, 2016 in Chinese Patent Application No. 201480045960.8 (with English translation and English translation of category of cited documents).

* cited by examiner

METHOD FOR MANUFACTURING TRANSPARENT ELECTRODE, TRANSPARENT ELECTRODE, AND ORGANIC ELECTROLUMINESCENCE DEVICE PROVIDED WITH THE SAME

CROSS-REFERENCE TO RELATED APPLICATIONS

The present application is a continuation of International Application No. PCT/JP2014/003956, filed Jul. 28, 2014, which is based upon and claims the benefits of priority to Japanese Application No. 2013-169751, filed Aug. 19, 2013. The entire contents of these applications are incorporated herein by reference.

BACKGROUND OF THE INVENTION

Field of the Invention

The present invention relates to a method for manufacturing a transparent electrode, a transparent electrode, and an organic electroluminescent device provided with the same, and more specifically to a method for manufacturing a transparent electrode using a coating or printing method.

Discussion of the Background

In recent years, the research and development of light emitting apparatuses provided with light emitting device type display panels is being underway. In such a light emitting device type display panel, self-luminous devices, such as organic electroluminescent devices (hereinafter referred to as "organic EL devices"), as the next-generation display devices are two-dimensionally arrayed.

The organic EL device includes an anode, a cathode, and an organic EL layer (light emitting functional layer) formed between the anode and the cathode in a pair. The organic EL layer includes an organic light emitting layer, a hole injection layer, and the like, for example. The organic EL device emits light with the energy generated by recombination of a hole and an electron in the organic light emitting layer.

Such an organic EL device has a light extraction side transparent electrode which is formed, generally, using tin doped indium oxide (indium tin oxide: ITO), zinc doped indium oxide (indium zinc oxide: IZO), or the like. However, in the case where a transparent electrode is formed using these materials, a thick and uniform film has to be formed to obtain a low resistance. Consequently, the light transmission of the transparent electrode is likely to be decreased, or products provided with the transparent electrode are likely to be expensive. In addition, the processes for forming a transparent electrode sometimes involve high temperature processing. For this reason, there have been limitations in decreasing the resistance of a transparent electrode on a film, in particular (e.g. see Patent Literature 1).

For the above transparent electrode, in recent years, transparent electrode techniques without using indium oxides, such as ITO, have been developed and disclosed. For example, for a method for forming a transparent electrode without using indium oxides, such as ITO, the following method is proposed (e.g. see Patent Literatures 2 and 3). In the method, a conductive surface is prepared, first, which is arranged with a thin wire structure made of a metal and/or an alloy and in a uniform mesh, comb or grid shape. Subsequently, on the conductive surface, an ink, in which a conductive polymeric material is dissolved or dispersed in a suitable solvent, for example, is coated using a coating or printing method to form a transparent conductive layer. Thus, a transparent electrode is formed without using indium oxides, such as ITO.

Patent Literature 1: JP-A-H10-162961
Patent Literature 2: JP-A-2005-302508
Patent Literature 3: JP-A-2006-093123

SUMMARY OF THE INVENTION

According to one aspect of the present invention, a transparent electrode includes a transparent substrate, a wire structure which partially covers a surface of the transparent substrate and includes a conductive material, and a transparent conductive layer formed on the transparent substrate and covering the wire structure. The transparent conductive layer includes plural layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3(a)-3(d) are cross sectional views each illustrating a principal part of a specific example of processing steps of a method for manufacturing a transparent electrode according to the second embodiment.

FIGS. 4(a)-4(d) are cross sectional views each illustrating a principal part of a specific example of processing steps of a method for manufacturing a transparent electrode according to the third embodiment.

DESCRIPTION OF THE EMBODIMENTS

The embodiments will now be described with reference to the accompanying drawings, wherein like reference numerals designate corresponding or identical elements throughout the various drawings.

Hereinafter will be described a method for manufacturing a transparent electrode, a transparent electrode, and an organic EL device provided with the same, according to some embodiments of the present invention. In the detailed description below, many specific details will be described for complete understanding of the embodiments of the present invention. However, it will be apparent that one or more embodiments can be implemented without these specific details. In addition, for simplifying the drawings, known structures and known devices are schematically illustrated only.

First Embodiment

The following description sets forth a configuration of a transparent electrode, a method for manufacturing a transparent electrode, and a configuration of an organic EL device according to a first embodiment.

<Configuration of the Transparent Electrode>

The transparent electrode according to the present embodiment includes a transparent substrate, a thin wire structure made of a metal and/or an alloy, and a transparent conductive layer formed using a coating or printing method. Normally, the transparent electrode is provided on the transparent substrate, with the thin wire structure and the transparent conductive layer being fabricated in this order from the substrate side.

From the viewpoint of improving luminance in the case of using the transparent electrode according to the present embodiment in an organic EL device, the surface resistivity of the conductive surface of the transparent electrode is preferably 0.01 Ω/sq. or more and 100 Ω/sq. or less, and more preferably 0.1 Ω/sq. or more and 10 Ω/sq. or less.

For example, the transparent electrode according to the present embodiment can be used for a transparent electrode for devices, such as LCDs, electroluminescent devices, plasma displays, electrochromic displays, solar cells, and touch panels, as well as for electronic paper, electromagnetic wave shielding materials, and the like. However, the transparent electrode according to the present embodiment is preferably used for organic EL devices because of the excellent conductivity and transparency and high smoothness.

(Transparent Substrate)

In the present embodiment, for the transparent substrate, for example, a plastic film, a plastic plate, glass, and other materials can be used.

Raw materials that can be used for the plastic film and the plastic plate include, for example, polyesters such as polyethylene terephthalate (PET) and polyethylene naphtahalate, polyolefins such as polyethylene (PE), polypropylene (PP), polystyrene, and EVA, vinyl resins such as polyvinyl chloride and polyvinylidene chloride, polyether ether ketone (PEEK), polysulfone (PSF), polyether sulfone (PES), polycarbonate (PC), polyamides, polyimides, acrylic resins, tri-acetyl cellulose (TAC), and the like.

The transparent substrate preferably has excellent surface smoothness. The surface smoothness of the transparent substrate preferably has an arithmetic average roughness (Ra) of 5 nm or less and a maximum height (Ry) of 50 nm or less. More preferably, Ra is 1 nm or less and Ry is 20 nm or less. For example, the surface of the transparent substrate may be smoothed by providing an undercoat layer such as of a thermosetting resin, ultraviolet curable resin, electron beam curable resin, and radiation curable resin, or may be smoothed by machining, such as polishing. To enhance the coating and adhesion properties of the transparent conductive layer, the transparent substrate may be subjected to surface treatment by corona, plasma, or UV/ozone, for example. The surface smoothness of the transparent substrate can be calculated on the basis of measurement using an atomic force microscope (AFM), for example.

The transparent substrate is preferably provided thereon with a gas barrier layer to block oxygen and moisture in the atmosphere. Materials of the gas barrier layer that can be used include metal oxides and metal nitrides such as silicon oxide, silicon nitride, silicon oxynitride, aluminum nitride, and aluminum oxide. These materials have a water vapor barrier function as well as an oxygen barrier function. Among the above materials, silicon nitride and silicon oxynitride are particularly preferable, which are excellent in barrier properties, solvent resistant barrier properties, and transparency. The gas barrier layer may have a multi-layer configuration as necessary. In this case, the gas barrier layer may be configured of only an inorganic layer, or may be configured of an inorganic layer and an organic layer. Methods for forming the gas barrier layer that can be used include, for example, resistance heating vapor deposition, electron-beam evaporation, reactive deposition, ion plating, and sputtering, depending on materials. The thickness of the gas barrier is not particularly limited. Typically, however, the thickness is preferably within a range of 5 nm or more to 500 nm or less per layer, and more preferably within a range of 10 nm or more to 200 nm or less per layer. The gas barrier layer only has to be provided on at least one surface of the transparent substrate, and more preferably on both surfaces.

(Thin Wire Structure)

The thin wire structure according to the present embodiment preferably has a low electrical resistance. Materials used for the structures commonly have an electric conductivity of $10^7$ S/cm or more. Specific examples of such conductive materials include metals, such as aluminum, silver, chromium, gold, copper, tantalum, and molybdenum, and/or alloys of these metals. Among these conductive materials, aluminum, chromium, copper, and silver, and alloys thereof are preferable, from the viewpoint of their high electric conductivity and easy handling of materials.

In the present embodiment, the above-described conductive material is disposed in a uniform mesh, comb, or grid shape, for example, to prepare the conductive surface, for the improvement of electrical conductivity. The width of the thin wire of a metal or alloy can be optionally determined, but preferably ranges from about 0.1 to 1,000 μm. The metal or alloy thin wires are preferably sequentially disposed at intervals (pitch) of 50 μm to 5 cm, but preferably, in particular, are sequentially disposed at intervals (pitch) of 100 μm to 1 cm.

By disposing the thin wire structure made of a metal and/or an alloy thereof, light transmission is decreased. The importance is to make the decrease as small as possible. It is important to preferably provide a light transmission of 80% or more, without making the interval between the thin wires excessively small or large. For the relationship between the width of the thin wire and the interval between the thin wires in plan view, the width of the thin wire only has to be determined depending on proposes, but the interval is preferably 1/10,000 or more and 1/5 or less, and more preferably 1/100 or more and 1/10 or less.

The thin wire structure made of a metal and/or an alloy thereof preferably has a height (thickness) of 0.05 μm or more but 10 μm or less, and more preferably 0.1 μm or more and 1 μm or less. For the relationship between the width and height of the thin wire, the height of the thin wire structure only has to be determined according to a desired electrical conductivity, but preferably used height is in a range of 1/10,000 or more and 10 times or less of the width of the thin wire. The thin wire structure may have a multi-layer configuration as necessary. In this case, the thin wire structure may be configured using only a single electrically conductive material, or may be configured using different conductive materials.

(Transparent Conductive Layer)

A solution used in forming the transparent conductive layer by coating contains a material (transparent conductive material) and a solvent for forming the transparent conductive layer. The transparent conductive layer preferably contains a high molecular weight compound exhibiting electrical conductivity. The high molecular weight compound may contain a dopant. The electrical conductivity of the high molecular weight compound is usually within a range of $10^{-5}$ S/cm or more to $10^5$ S/cm or less, and preferably within a range of $10^{-3}$ S/cm or more to $10^5$ S/cm or less. The transparent conductive layer is preferably substantially formed of a high molecular weight compound having electrical conductivity. For example, transparent conductive materials that can be used include polyaniline and its derivatives, polythiophene and its derivatives, and the like. A known dopant can be used as the dopant. For example, dopants can include organic sulfonic acids such as polystyrenesulfonic acid and dodecylbenzenesulfonic acid, and Lewis acids such as $PF_5$, $AsF_5$, and $SbF_5$. The high molecular weight compound having electrical conductivity may be a self-doped high molecular weight compound, in which a dopant is directly bonded to the high molecular weight compound.

The transparent conductive layer is preferably configured to contain polythiophene and/or a derivative thereof, but is preferably substantially formed of polythiophene and/or a derivative thereof. The polythiophene and/or a derivative thereof may contain a dopant. Polythiophene, a derivative thereof, or a mixture of polythiophene and a derivative thereof is easily dissolved or dispersed in an aqueous solvent, such as water and alcohol, and thus favorably used for a solute of a coating liquid used for coating. The materials mentioned above are of high electrical conductivity, and favorably used for an electrode material. These materials have HOMO energy of about 5.0 eV whose difference from the HOMO energy of an organic light emitting layer usually used for an organic EL device is as low as about 1 eV, and enable efficient injection of holes into the organic light emitting layer. Therefore, these materials can be particularly favorably used for anode materials. Further, since these materials are of high transparency, they are favorably used for a light extraction side electrode of an organic EL device.

The transparent conductive layer is preferably configured to contain polyaniline and/or a derivative thereof, and preferably substantially formed of polyaniline and/or a derivative thereof. Polyaniline and/or a derivative thereof may contain a dopant. Polyaniline, a derivative thereof, or a mixture of polyaniline and a derivative thereof is excellent in electrical conductivity and stability. Therefore, these materials are favorably used for electrode materials. These materials are of high transparency, and thus favorably used for a light extraction side electrode of an organic EL device.

<Method for Manufacturing Transparent Electrode>

A method for manufacturing a transparent electrode according to the present embodiment will be described. Usually, a transparent electrode is manufactured by providing a thin wire structure and a transparent conductive layer in this order on a transparent substrate. The present embodiment shows the case, for example, where the transparent conductive layer is formed of two separately prepared layers. However, the transparent conductive layer may be formed of multiple separately prepared layers of two or more.

In the method for manufacturing a transparent electrode according to the present embodiment, first, the thin wire structure mentioned above is formed on one surface of the transparent substrate mentioned above, the surface being a transparent electrode-forming region.

The method for forming the thin wire structure is not particularly limited. For example, in the method for forming the thin wire structure, a film made of component materials of the thin wire structure is formed by resistance heating vapor deposition, electron-beam evaporation, sputtering, lamination in which a metal thin film is thermally compressed, or the like, followed by forming the pattern mentioned above by etching using a photoresist.

Other than the above method, a method of forming a film from a solution containing a material for forming the thin wire structure can be used. There is no limitation in the solvent used for forming a film from a solution, as far as the solvent can dissolve the material for forming the thin wire structure. For example, methods of forming a film from a solution include coating methods, such as spin coating, casting, micro gravure coating, gravure coating, bar coating, roll coating, wire bar coating, dip coating, spray coating, screen printing, flexographic printing, offset printing, slit coating, ink jet printing, and nozzle printing. In particular, a method of forming a film that can directly form the above-described pattern is preferable. Although methods can be appropriately selected, favorable methods are printing methods, such as screen printing, flexographic printing, and offset printing, and injection coating methods, such as ink jet printing and nozzle printing. After forming the film, the film is dried and set to thereby form the thin wire structure.

Subsequently, a transparent conductive material-containing solution is coated over a transparent electrode-forming region to form a transparent conductive layer. For example, methods of forming a film include coating methods, such as spin coating, casting, micro gravure coating, gravure coating, bar coating, roll coating, wire bar coating, dip coating, spray coating, screen printing, flexographic printing, offset printing, slit coating, ink jet printing, and nozzle printing. Specifically, to form a film over the entire transparent electrode-forming region, a method of uniformly coating a solution is preferable. Although methods can be appropriately selected, favorable methods are coating methods, such as spin coating, bar coating, wire bar coating, dip coating, spray coating, slit coating, casting, micro gravure coating, gravure coating, and roll coating.

Subsequently, the transparent substrate, which is coated with the transparent conductive material-containing solution over the entire transparent electrode-forming region, is heated in a drying treatment chamber at a temperature of 100° C. or more, for example. Thus, the solvent contained in the transparent conductive material-containing solution is evaporated, and the transparent conductive material is adhered onto the transparent substrate and the thin wire structure, thereby forming a transparent conductive layer.

Subsequently, the transparent conductive material-containing solution is again coated over the transparent electrode-forming region to form a film of a transparent conductive layer. The method of forming a film can be a coating method similar to the method of forming a film for the first transparent conductive layer described above.

Subsequently, the transparent substrate, which has again been coated with the transparent conductive material-containing solution over the entire transparent electrode-forming region, is heated in a drying treatment chamber at a temperature of 100° C. or more, for example. Thus, the solvent contained in the transparent conductive material-containing solution is evaporated, and the transparent conductive material is adhered onto the transparent substrate and the thin wire structure. The transparent conductive layer is formed in this way, thereby completing formation of the transparent electrode.

In the case where the transparent conductive layer is separated into two or more multiple layers, the above-described method of forming a film and heat treatment are repeatedly performed. Thus, the transparent conductive layer having two or more multiple layers can be formed.

<Configuration of Organic EL Device>

The organic EL device according to the present embodiment is characterized in that the device includes the transparent electrode described above. In the organic EL device according to the present embodiment, the above-described transparent electrode is used for an anode. For the organic light emitting layer and the cathode, any material and configuration generally used for organic EL devices can be used. For example, an organic EL device can have various element configurations, including laminates of:

Anode/Organic light emitting layer/Cathode;

Anode/Hole transport layer/Organic light emitting layer/Electron transport layer/Cathode;

Anode/Hole injection layer/Hole transport layer/Organic light emitting layer/Electron transport layer/Cathode;

Anode/Hole injection layer/Organic light emitting layer/Electron transport layer/Electron injection layer/Cathode; and Anode/Hole injection layer/Organic light emitting layer/Electron injection layer/Cathode.

Herein, the symbol "/" expresses that layers sandwiching the symbol "/" are laminated adjacent to each other. The same applies to the following description.

The organic EL device according to the present embodiment may have two or more organic light emitting layers. For example, the organic EL device having two organic light emitting layers can have the following layer configuration:

Anode/Charge injection layer/Hole transport layer/Organic light emitting layer/Electron transport layer/Charge injection layer/Charge generation layer/Charge injection layer/Hole transport layer/Organic light emitting layer/Electron transport layer/Charge injection layer/Cathode.

The organic EL device having three or more organic light emitting layers can have the following layer configuration including two or more repetition units (each unit being composed of: Charge generation layer/Charge injection layer/Hole transport layer/Organic light emitting layer/Electron transport layer/Charge injection layer):

Anode/Charge injection layer/Hole transport layer/Organic light emitting layer/Electron transport layer/Charge injection layer/Repetition unit/Repetition unit/ . . . /Cathode.

In the above layer configurations, the layers other than the anode, the cathode, and the organic light emitting layer can be omitted as necessary.

The charge generation layer herein refers to a layer that generates holes and electrons with the application of an electric field. For example, the charge generation layer can be a thin film formed of vanadium oxide, ITO, molybdenum oxide, or the like.

In the following, the hole injection layer, the hole transport layer, the organic light emitting layer, the electron transport layer, the electron injection layer, and the cathode will be described.

(Layers Provided Between Anode and Organic Light Emitting Layer)

For example, the layers provided as necessary between the anode and the organic light emitting layer can be a hole injection layer, a hole transport layer, and an electron blocking layer. The hole injection layer improves the efficiency of injecting holes from the anode. The hole transport layer improves the injection of holes from a layer located nearer the hole injection layer or the anode. In the case where the hole injection layer or the hole transport layer blocks the transport of electrons, these layers may each be referred to as an electron blocking layer. When these layers can block the transport of electrons, an element that only allows passage of an electronic current therethrough may be prepared, for example, to confirm the blocking effect in terms of the decrease in the current value of the element.

(Hole Injection Layer)

The hole injection layer can be provided between the anode and the hole transport layer or between the anode and the organic light emitting layer. Any known materials can be appropriately used for a material for forming the hole injection layer, with no specific limitation. For example, as these materials, mention can be made of oxides such as of phenylamines, starburst amines, phthalocyanines, hydrazone derivatives, carbazole derivatives, triazole derivatives, imidazole derivatives, oxadiazole derivatives having an amino group, and vanadium oxide, tantalum oxide, and molybdenum oxide, as well as amorphous carbon, polyaniline, polythiophene derivatives, and other compounds.

For example, a method for forming a film of the hole injection layer can be a film formation from a solution containing a material (hole injection material) which will become the hole injection layer. There is no particular limitation in the solvent used for forming a film from a solution as far as the solvent can dissolve a hole injection material. For example, as such solvents, mention can be made of chlorine solvents such as chloroform, methylene chloride, and dichloroethane, ether solvents such as tetrahydrofuran, aromatic hydrocarbon solvents such as toluene and xylene, ketone solvents such as acetone and methylethylketone, ester solvents such as ethyl acetate, butyl acetate, and ethyl cellosolve acetate, and water.

For example, methods for forming a film from a solution include coating methods such as spin coating, casting, micro gravure coating, gravure coating, bar coating, roll coating, wire bar coating, dip coating, spray coating, screen printing, flexographic printing, offset printing, slit coating, ink jet printing, and nozzle printing.

The thickness of the hole injection layer is preferably within a range of 5 nm or more to 300 nm or less. When the thickness is less than 5 nm, the manufacture of the hole injection layer is likely to be difficult. On the other hand, when the thickness exceeds 300 nm, the drive voltage and the voltage applied to the hole injection layer are likely to be increased.

(Hole Transport Layer)

Any material can be used for a material (hole transport material) configuring the hole transport layer, with no specific limitations. For example, such materials include aromatic amine derivatives such as N,N'-diphenyl-N,N'-di(3-methylphenyl)4,4'-diaminobiphenyl (TPD), and 4,4'-bis[N-(1-naphthyl)-N-phenyl amino]biphenyl (NPB), polyvinyl carbazole or its derivatives, polysilane or its derivatives, polysiloxane derivatives having an aromatic amine on the side chain or the main chain, pyrazoline derivatives, arylamine derivatives, stilbene derivatives, triphenyldiamine derivatives, polyaniline or its derivatives, polythiophene or its derivatives, polyarylamine or its derivatives, polypyrrole or its derivatives, poly(p-phenylene vinylene) or its derivatives, and poly(2,5-thienylenevinylene) or its derivatives.

Preferable materials as the hole transport material among these materials are high molecular weight hole transport materials such as polyvinyl carbazole or its derivatives, polysilane or its derivatives, polysiloxane derivatives having an aromatic amine on the side chain or the main chain, polyaniline or its derivatives, polythiophene or its derivatives, polyarylamine or its derivatives, poly(p-phenylene vinylene) or its derivatives, and poly(2,5-thienylenevinylene) or its derivatives. When a low molecular weight hole transport material is used, the material is preferably dispersed in a high molecular weight binder.

The method of forming a film for the hole transport layer has no specific limitation. A method of forming a film using a low molecular weight hole transport material can be one in which a film is formed from a mixed solution that contains a high molecular weight binder and a hole transport material.

A method of forming a film using a high molecular weight hole transport material can be one in which a film is formed from a solution that contains a hole transport material. Any solvent that can dissolve the hole transport material can be used for forming a film from a solution, with no specific limitation. Examples of solvents that can be used include the solvents shown in the section relating to the hole injection layer. Methods of forming a film from a solution can include coating methods similar to ones used in forming a film for the hole injection layer.

The thickness of the hole transport layer has no limitation specifically. However, the thickness can be appropriately changed depending on a target design. The thickness is preferably within a range of 1 nm or more to 1,000 nm or less. When the thickness is less than the above lower limit, the manufacture of the hole transport layer is likely to be difficult, or a sufficient effect of the hole transport is unlikely to be obtained, for example. On the other hand, when the thickness exceeds the above upper limit, the drive voltage and the voltage applied to the hole transport layer are likely to be increased. Thus, the thickness of the hole transport layer is preferably within a range of 1 nm or more to 1,000 nm or less, more preferably within a range of 2 nm or more to 500 nm or less, and still more preferably within a range of 5 nm or more to 200 nm or less.

(Organic Light Emitting Layer)

The organic light emitting layer mainly has an organic substance (low molecular weight compound or high molecular weight compound) having fluorescence or phosphorescence. The organic light emitting layer may further include a dopant material. For example, materials (organic light emitting materials) that can be used for forming the organic light emitting layer of the present embodiment include the following materials.

"Dye Materials"

For example, dye materials can include cyclopentamine derivatives, quinacridone derivatives, coumarin derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, and pyrazoline dimers.

"Metal Complex Materials"

For example, metal complex materials can include metal complexes having luminescence in a triplet excited state, such as iridium complexes and platinum complex, and include metal complexes, such as aluminum quinolinol complexes, benzoquinolinol beryllium complexes, benzoxazolyl zinc complexes, benzothiazole zinc complexes, azomethylzinc complexes, porphyrin zinc complexes, and europium complexes, which contain Al, Zn, Be or the like, or a rare earth metal of Tb, Eu, Dy or the like as a central metal, and contain a structure of oxadiazole, thiadiazole, phenylpyridine, phenylbenzoimidazole, or quinoline as a ligand.

"High Molecular Weight Materials"

For example, high molecular weight materials can include polyparaphenylene vinylene derivatives, polythiophene derivatives, polyparaphenylene derivatives, polysilane derivatives, polyacetylene derivatives, polyfluorene derivatives, polyvinyl carbazole derivatives, and those materials obtained by polymerization of the above-indicated dyes or the metal complex light emitting materials.

In the above organic light emitting materials, for example, materials emitting blue light include distyrylarylene derivatives, oxadiazole derivatives, polymers of these materials, polyvinyl carbazole derivatives, polyparaphenylene derivatives, polyfluorene derivatives, and the like.

For example, materials emitting green light include quinacridone derivatives, coumarin derivatives, polymers of these materials, polyparaphenylene vinylene derivatives, polyfluorene derivatives, and the like.

For example, materials emitting red light include coumarin derivatives, thiophene ring compounds, and polymers of these materials, polyparaphenylene vinylene derivatives, polythiophene derivatives, polyfluorene derivatives, and the like.

"Dopant Materials"

To improve luminous efficiency or change emission wavelengths, a dopant can be added to the organic light emitting layer. For example, such dopants include perylene derivatives, coumarin derivatives, rubrene derivatives, quinacridone derivatives, squarylium derivatives, porphyrin derivatives, styryl dyes, tetracene derivatives, pyrazolone derivatives, decacyclene, and phenoxazone. The thickness of the organic light emitting layer is normally in a range of about 2 nm to 200 nm.

Methods of forming a film for the organic light emitting layer can include those which form a film from a solution that contains an organic light emitting material. Any solvent that can dissolve an organic light emitting material can be used for forming a film from a solution, with no specific limitation. Examples of such solvents can include the ones shown in the section relating to the hole injection layer. Methods of forming a film from a solution can include those coating methods which are similar to the ones used for the method of forming a film for the hole injection layer mentioned above.

(Layers Provided Between Cathode and Organic Light Emitting Layer)

For example, layers provided, as necessary, between the cathode and the organic light emitting layer can include an electron injection layer, an electron transport layer, and a hole blocking layer. In the case where both of the electron injection layer and the electron transport layer are provided between the cathode and the organic light emitting layer, a layer in contact with the cathode is referred to as an electron injection layer, and the layers except for the electron injection layer are referred to as electron transport layers.

The electron injection layer improves the efficiency of injecting electrons from the cathode. The electron transport layer improves the injection of electrons from the cathode, the electron injection layer, or a layer located nearer the cathode. The hole blocking layer blocks the transport of holes. In the case where the electron injection layer and/or the electron transport layer have a function of blocking the transport of holes, these layers may have a function as a hole blocking layer.

(Electron Transport Layer)

As materials that contain the electron transport layer (electron transport materials), known materials can be used. For example, as these materials, mention can be made of metal complexes such as of oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone or its derivatives, diphenyl dicyanoethylene or its derivatives, diphenoquinone derivatives, or 8-hydroxyquinoline or its derivatives, and polyquinoline or its derivatives, polyquinoxaline or its derivatives, polyfluorene or its derivatives, and the like.

Among these materials, complexes such as of oxadiazole derivatives, benzoquinone or its derivatives, anthraquinone or its derivatives, 8-hydroxyquinoline or its derivatives, and polyquinoline or its derivatives, polyquinoxaline or its derivatives, and polyfluorene or its derivatives are preferable as electron transport materials, but 2-(4-biphenylyl)-5-(4-t-butylphenyl)-1,3,4-oxadiazole, benzoquinone, anthraquinone, tris-(8-quinolinol) aluminum, and polyquinoline are more preferable.

There is no particular limitation in the method of forming a film for the electron transport layer. However, in a method using a low molecular weight electron transport material, a film can be made from a liquid mixture that contains a high molecular weight binder and an electron transport material. In a method using a high molecular weight electron transport material, a film can be made from a solution that contains an electron transport material. Any solvent that can dissolve an electron transport material can be used for forming a film from a solution, with no specific limitation. Examples of such solvents can include the ones shown in the section relating to the hole injection layer. Methods of forming a film from a solution can include those coating methods which are similar to the ones used for the method of forming a film for the hole injection layer mentioned above.

The optimum value of the thickness of the electron transport layer depends on a material to be used. The thickness can be appropriately changed depending on a target design. The electron transport layer is at least required to have a thickness with which the formation of pin holes can be prevented. For example, the thickness is preferably within a range of 1 nm or more to 1,000 nm or less, more preferably within a range of 2 nm or more to 500 nm or less, and still more preferably within a range of 5 nm or more to 200 nm or less.

(Electron Injection Layer)

As a material configuring the electron injection layer (electron injection material), an optimum one is appropriately selected according to the type of organic light emitting layer. For example, such materials include alkali metals, alkali earth metals, alloys that contain one or more of alkali metals and alkali earth metals, oxides of alkali metals or alkali earth metals, halides, carbon oxides, or mixtures of these materials. As examples of alkali metals, alkali metal oxides, halides, and carbon oxides, mention can be made of lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate, and the like. Examples of alkali earth metals, oxides of alkali earth metals, halides, and carbon oxides can include magnesium, calcium, barium, strontium, magnesium oxide, magnesium fluoride, calcium oxide, calcium fluoride, barium oxide, barium fluoride, strontium oxide, fluoride strontium, magnesium carbonate, and the like. The electron injection layer may be configured by a laminate of two or more layers made such as of lithium/calcium fluorides. For example, the electron injection layer is formed by means of various vapor-deposition methods, sputtering method, and various coating methods. The thickness of the electron injection layer is preferably within a range of 1 nm or more to 1,000 nm or less.

(Cathode)

The material used for the cathode (cathode material) preferably has a small work function and enables easy electron injection into the organic light emitting layer, and/or has a high electrical conductivity, and/or has a high reflectance of visible light. Specifically, such cathode materials include metals, metal oxides, alloys, graphite or graphite intercalation compounds, inorganic semiconductors such as zinc oxidize, and the like.

For example, the above metals that can be used include alkali metals or alkali earth metals, transition metals or group III-B metals, and the like. As specific examples of these metals, mention can be made of lithium, sodium, potassium, rubidium, cesium, beryllium, magnesium, calcium, strontium, barium, gold, silver, platinum, copper, manganese, titanium, cobalt, nickel, tungsten, tin, aluminum, scandium, vanadium, zinc, yttrium, indium, cerium, samarium, europium, terbium, ytterbium, and the like.

The alloys that can be used contain at least one of the above metals. Specifically, as such alloys, mention can be made of magnesium-silver alloys, magnesium-indium alloys, magnesium-aluminum alloys, indium-silver alloys, lithium-aluminum alloys, lithium-magnesium alloys, lithium-indium alloys, calcium-aluminum alloys, and the like.

As the cathode, a transparent electrode is used as necessary. For example, materials used for the cathode include conductive oxides, such as indium oxide, zinc oxide, tin oxide, ITO, and IZO, and conductive organic substances, such as polyaniline or its derivatives and polythiophene or its derivatives.

The cathode may have a laminate structure with two or more layers. The electron injection layer may be used as the cathode.

The thickness of the cathode can be appropriately selected from a viewpoint of electrical conductivity or durability. For example, the thickness is within a range of 10 nm or more to 10,000 nm or less, preferably within a range of 20 nm or more to 1,000 nm or less, and more preferably within a range of 50 nm or more to 500 nm or less.

For example, the organic EL device according to the present embodiment can be used such as for self-luminous displays, backlights for liquid crystal, and lighting fixtures. The organic EL device according to the present embodiment can uniformly emit light without unevenness. Thus, the organic EL device is preferably used for lighting, for example.

<Advantageous Effects>

Referring to FIGS. 1 and 2(a)-2(d), hereinafter are described the advantageous effects of using the configuration of the transparent electrode and the method for manufacturing the same as mentioned above, by way of an example and a comparative example for confirming the advantageous effects.

Figure 1:
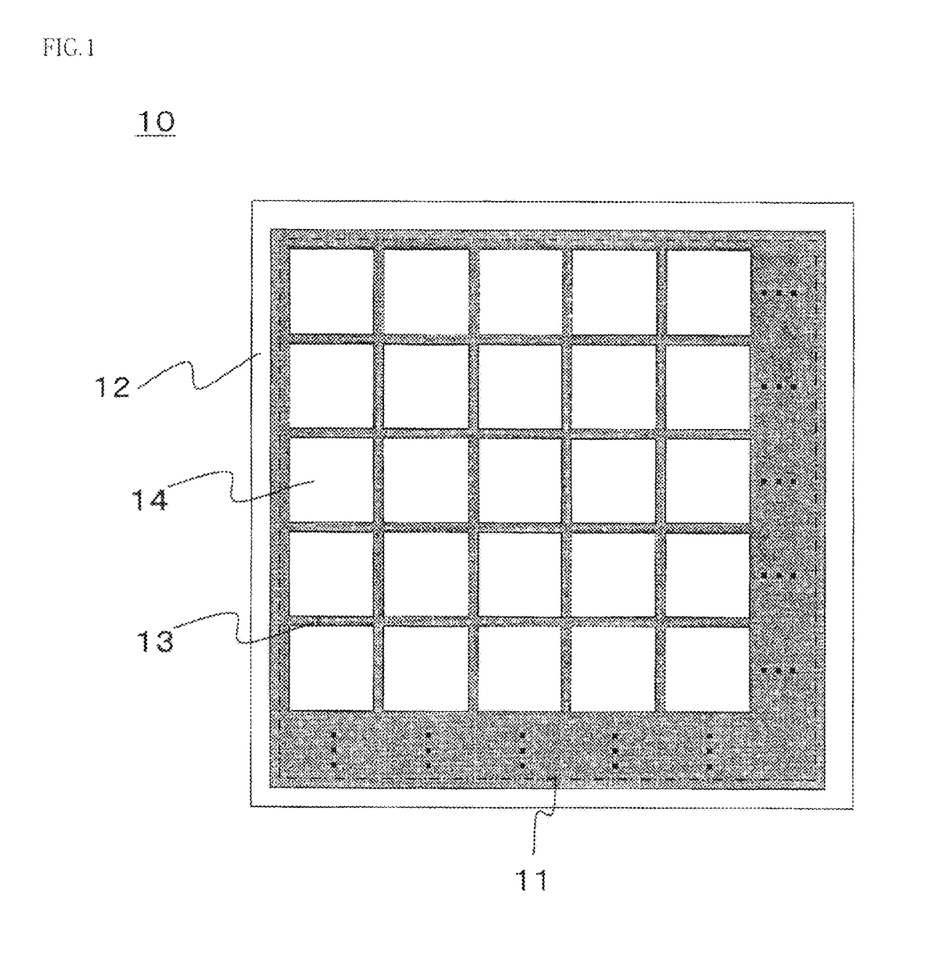
FIG. 1 is a schematic plan view illustrating a structure of a transparent substrate formed with a thin wire structure according to first, second, and third embodiments.

FIG. 1 is a schematic plan view illustrating the state where thin wire structure 13 is provided on a transparent substrate 12. As an example, the thin wire structure 13 is disposed in a grid shape on the transparent substrate 12. However, the thin wire structure 13 has no limitation in shape specifically. FIGS. 2(a)-(d) are diagrams illustrating a specific example of a principal part, for fabricating a transparent electrode of the present example on a transparent substrate 10 on which the components including the thin wire structure 13 have been prepared. The following description sets forth the case where a transparent conductive layer 21 is separated into two layers as an example of separation into a plurality of layers.

Figure 2A:
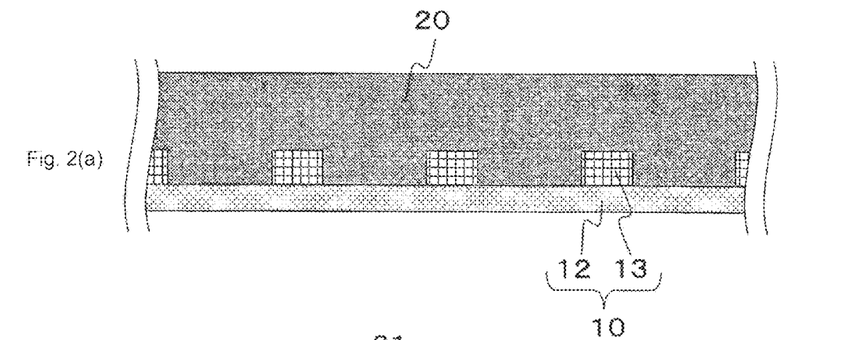
FIGS. 2(a)-2(d) are cross sectional views each illustrating a principal part of a specific example of processing steps of a method for manufacturing a transparent electrode according to the first embodiment.

First, as illustrated in FIG. 2(a), a transparent conductive material-containing solution 20 is coated over the entire surface of a transparent electrode-forming region 11 (see FIG. 1) so as to cover the transparent substrate 10, including the thin wire structure 13 provided thereon. FIG. 2(a)

illustrates a state immediately after coating the transparent conductive material-containing solution 20 as a first layer.

Figure 2B:
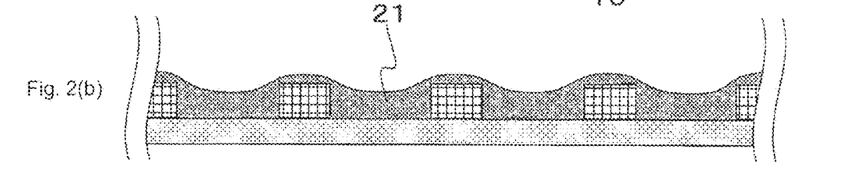

After that, heat treatment is performed to dry the transparent conductive material-containing solution 20 and evaporate the solvent. Consequently, as illustrated in FIG. 2(b), the transparent conductive layer 21 is formed throughout the surface of the transparent substrate 10, including the thin wire structure 13 provided thereon. At this point, the height of the transparent conductive layer 21 is uneven because of the influence of the shape of the thin wire structure 13. Thus, a transparent electrode having a low surface smoothness is prepared.

It is preferable at this point that the thickness of the transparent conductive layer 21 is thinner (lower) than the thickness (height) of the thin wire structure 13 in a region 14 except for a thin wire structure-forming region, from the viewpoint of reducing the contact angle between the transparent substrate 12 and the thin wire structure 13 or reducing the amount of materials used. Thus, in the region 14 except for the thin wire structure-forming region, the height of a part of the interface that separates the layers of the transparent conductive layer 21 from each other is made lower than the height of the thin wire structure 13 (topmost part of the thin wire structure 13).

The shape of the transparent conductive layer 21 at this time is greatly affected by the shape of the thin wire structure 13. Therefore, the transparent conductive layer 21 on the thin wire structure 13 has convexities, while the region 14 except for the thin wire structure-forming region has concavities. Thus, being located on the thin wire structure 13 (i.e., in the thin wire structure-forming region), the interface that separates the layers of the transparent conductive layer 21 from each other has convexities, while the region 14 except for the thin wire structure-forming region has concavities, when viewed from a direction parallel to the transparent substrate.

Figure 2C:
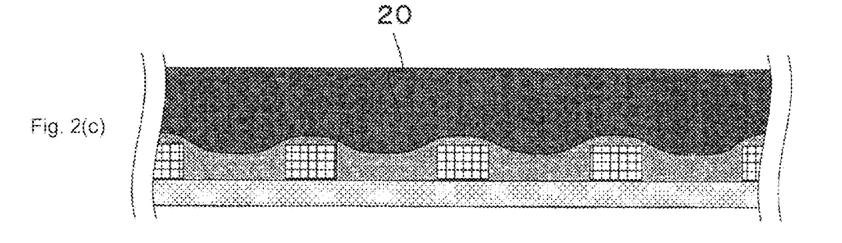

Subsequently, as illustrated in FIG. 2(c), the transparent conductive material-containing solution 20 is again coated over the entire surface of the transparent electrode-forming region 11 (see FIG. 1) so as to cover the transparent substrate 10, including the thin wire structure 13 provided thereon. FIG. 2(c) illustrates a state immediately after coating the transparent conductive material-containing solution 20 as a second layer.

Figure 2D:
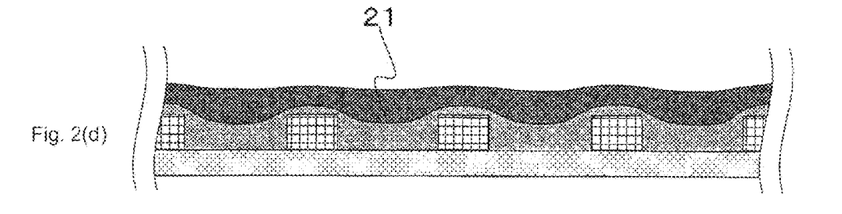

After that, heat treatment is performed to dry the transparent conductive material-containing solution 20 and evaporate the solvent. As a result, as illustrated in FIG. 2(d), the transparent conductive layer 21 is formed entirely covering the transparent substrate 10, including the thin wire structure 13 provided thereon. In the present example, the transparent conductive layer 21 is formed of two separately prepared layers. Thus, the influence of the shape of the thin wire structure 13 is reduced, and uniformity in the height of the transparent conductive layer 21 is improved. Accordingly, a transparent electrode of high surface smoothness is prepared.

In FIGS. 2(a)-2(d), let us consider that the transparent conductive layer 21 is formed of a plurality of separately prepared layers and that a transparent electrode of high surface smoothness can be prepared resultantly.

The transparent conductive material-containing solution 20 coated onto the transparent substrate 10 is dried and set, while the solution 20 flows, in the process of drying, for the formation of a film. Generally, in the case where a solution is coated onto the surface of a substrate on which a structural body is formed, the solution, which is in the process of being dried, is particularly attracted to the contact point between the structural body and the substrate, due to capillary action. Accordingly, the coating film is formed on the side faces of the structural body, forming a shape where the solution has climbed up on the side faces of the structural body. In the present example, the transparent conductive material-containing solution 20, which is in the process of being dried, will particularly be attracted to the contact point between the thin wire structure 13 and the transparent substrate 12 due to capillary action, causing unevenness in the height of the transparent conductive layer 21. This state is provided as a comparative example (state shown in FIG. 2(b)).

In the case where a film is formed of a plurality of separately prepared layers, the coating of the solution 20 for forming the final layer is considered to be a dominant factor for the shape of the transparent conductive layer 21 and the surface smoothness of the transparent electrode. Since the transparent conductive layer 21 is formed of a plurality of separately prepared layers, in the process of forming the final layer, there can already be the coating that has climbed up on the side faces of the thin wire structure 13. Accordingly, the angle between the structural body (thin wire structure 13 of the present example) projected on the upper surface of the transparent substrate 12 and the transparent substrate 12 is reduced at the contact point therebetween. Thus, the force of attracting the transparent conductive material-containing solution 20, which is in the process of being dried, caused by capillary action is also considered to be reduced. Therefore, in the present example, uniformity in the height of the transparent conductive layer 21 is improved, compared with in the state of the comparative example (state shown in FIG. 2(b)). Accordingly, a transparent electrode of high surface smoothness can be prepared (state shown in FIG. 2(d)).

If the under layer material is dissolved in coating the solution for forming the final layer, the already formed coating films will also be brought into a state of a solution, degrading the above-described advantageous effects. For this reason, it is desirable that heat treatment is performed prior to coating the final layer to thereby harden the coating films.

Second Embodiment

The following description sets forth the configuration of a transparent electrode, a method for manufacturing the transparent electrode, and the configuration of an organic EL device according to a second embodiment.

<Method for Manufacturing Transparent Electrode>

When the configuration of the transparent electrode, the method for manufacturing the transparent electrode, and the configuration of the organic EL device according to the second embodiment are compared with those according to the first embodiment described above, the configurations are the same between the embodiments. However, the second embodiment is different from the first embodiment in the region for forming the transparent conductive layer 21 in the method for manufacture, which is the characteristic of the second embodiment. Therefore, referring to FIGS. 1 and 3(a)-3(d), the method for manufacturing the transparent electrode will be described, omitting description on the rest of the configuration. The present embodiment describes, as an example, the case where the transparent conductive layer is formed of two separately prepared layers. However, the transparent conductive layer may be formed of multiple separately prepared layers of two or more.

The first embodiment has dealt with the manufacturing method in which the transparent conductive layer 21 is formed of a plurality of separately prepared layers and the layers are formed over the entire surface of the transparent electrode-forming region 11. In the second embodiment, among the plurality of separate layers forming the transparent conductive layer 21, the first layer is formed in the region 14 in the transparent electrode-forming region 11, excepting the thin wire structure-forming region, and the subsequent layers are formed covering the entire transparent electrode-forming region 11.

Figures 3A, 3D:
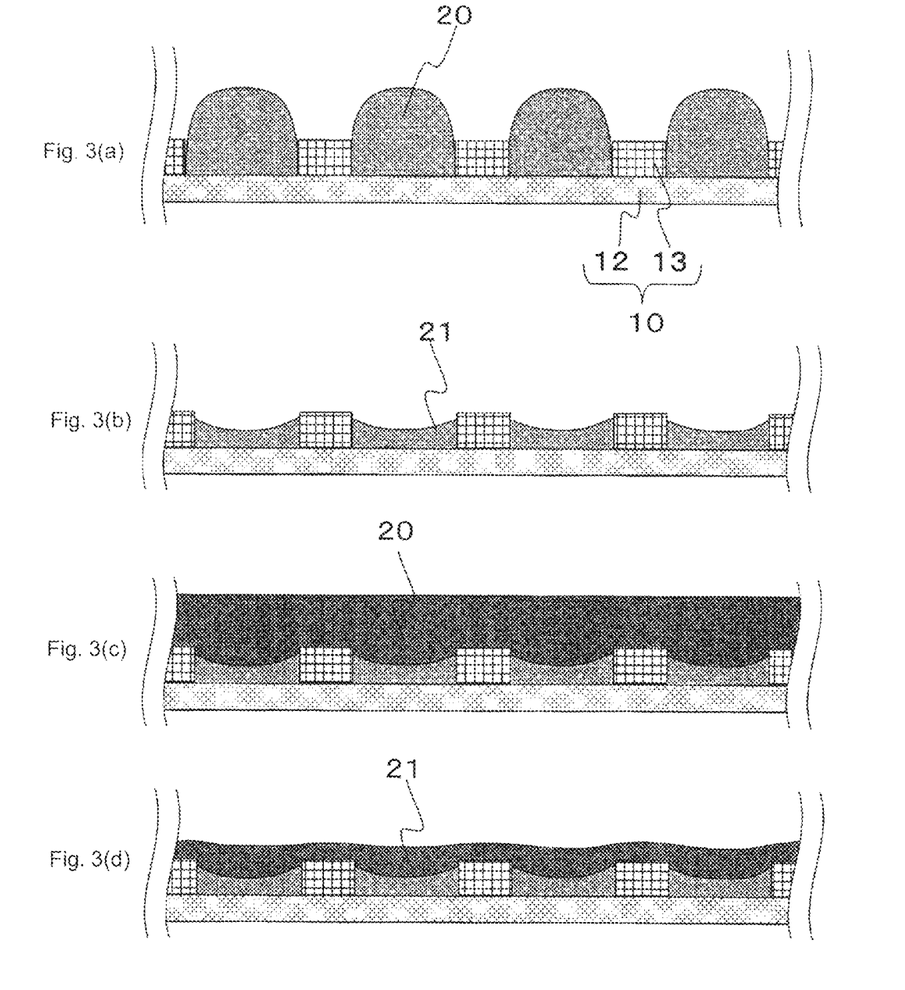

As illustrated in FIG. 3(a), on the transparent substrate 12, the transparent conductive material-containing solution 20 is coated onto the region 14 except for the thin wire structure-forming region in the transparent electrode-forming region 11 (partial coating step). FIG. 3(a) illustrates a state immediately after coating the transparent conductive material-containing solution 20 as a first layer.

It is particularly preferable that the method of forming a film at this time can form a pattern. The method can be selected in an appropriate manner. For example, favorable methods include printing methods, such as screen printing, flexographic printing, and offset printing, and injection coating methods, such as ink jet printing and nozzle printing, which are different from the first embodiment.

After that, heat treatment is performed to dry the transparent conductive material-containing solution 20 and evaporate the solvent. Thus, as illustrated in FIG. 3(b), on the transparent substrate 12, the transparent conductive layer 21 is formed in the region 14 except for the thin wire structure-forming region in the transparent electrode-forming region 11. At this point, the height of the transparent conductive layer 21 is uneven being influenced by the shape of the thin wire structure 13. The surface (top face) of the thin wire structure 13 is exposed.

Subsequently, as illustrated in FIG. 3(c), the transparent conductive material-containing solution 20 is coated over the entire surface of the transparent electrode-forming region 11 to cover the transparent substrate 10, including the thin wire structure 13 provided thereon (entire surface coating process). FIG. 3(c) illustrates a state immediately after coating the transparent conductive material-containing solution 20 as a second layer.

As a method of forming a film at this time, it is preferable to use a method that is able to evenly form a coating film over the entire surface of the transparent electrode-forming region 11. Such a method can be selected in an appropriate manner. For example, favorable methods include spin coating, bar coating, wire bar coating, dip coating, spray coating, slit coating, casting, micro gravure coating, gravure coating, roll coating, and the like. These methods are different from those used for forming the first layer of the transparent conductive layer 21.

After that, heat treatment is performed to dry the transparent conductive material-containing solution 20 and evaporate the solvent. As illustrated in FIG. 3(d), the transparent conductive layer 21 is formed throughout the surface of the transparent substrate 10, including the thin wire structure 13 provided thereon. Since the transparent conductive layer 21 is formed of two separately prepared layers, the influence of the shape of the thin wire structure 13 can be reduced and uniformity in the height of the transparent conductive layer 21 is improved. Accordingly, a transparent electrode of high surface smoothness is prepared.

<Advantageous Effects>

The following description sets forth the advantageous effects in the case of using the method for manufacturing a transparent electrode shown in FIGS. 3(a)-3(d).

In the present embodiment, the first layer of the transparent conductive layer 21 is formed in the region 14 except for the thin wire structure-forming region in the transparent electrode-forming region 11, and the subsequent layers are formed over the entire surface of the transparent electrode-forming region 11. In this case as well, in forming the final layer, the influence of the shape of the thin wire structure 13 can be reduced and the advantageous effects similar to those of the first embodiment can be obtained. In the present embodiment, the transparent conductive layer 21 is formed only in the region 14 except for the thin wire structure-forming region. Accordingly, the amount of the transparent conductive material used is decreased, and the advantageous effects similar to those of the first embodiment can be obtained. In the present embodiment, the transparent conductive layer 21 is formed as the first layer in the region 14 except for the thin wire structure-forming region. Thus, concavo-convex pattern on the transparent substrate 12 caused by the thin wire structure 13 can be most effectively used.

Third Embodiment

Next, the configuration of a transparent electrode, a method for manufacturing a transparent electrode, and the configuration of an organic EL device according to a third embodiment will be described.

<Method for Manufacturing Transparent Electrode>

When the configuration of the transparent electrode, the method for manufacturing the transparent electrode, and the configuration of the organic EL device according to the third embodiment are compared with those according to the first and second embodiments described above, the configurations are the same between the embodiments. However, the third embodiment is different from the first and second embodiments in the region for forming the transparent conductive layer in the method for manufacture, which is characteristic of the third embodiment. Therefore, referring to FIGS. 1 and 4(a)-4(d), the method for manufacturing the transparent electrode will be described, omitting description on the rest of the configuration. The present embodiment describes, as an example, the case where the transparent conductive layer 21 is formed of two separately prepared layers. However, the transparent conductive layer may be formed of multiple separately prepared layers of two or more.

In the third embodiment, in the layers of the transparent conductive layer 21 to be formed of a plurality of separately prepared layers, the second layer, which is the final layer, is formed in the region 14 except for the thin wire structure-forming region in the transparent electrode-forming region 11, which is characteristic of the present embodiment.

Figure 4A:
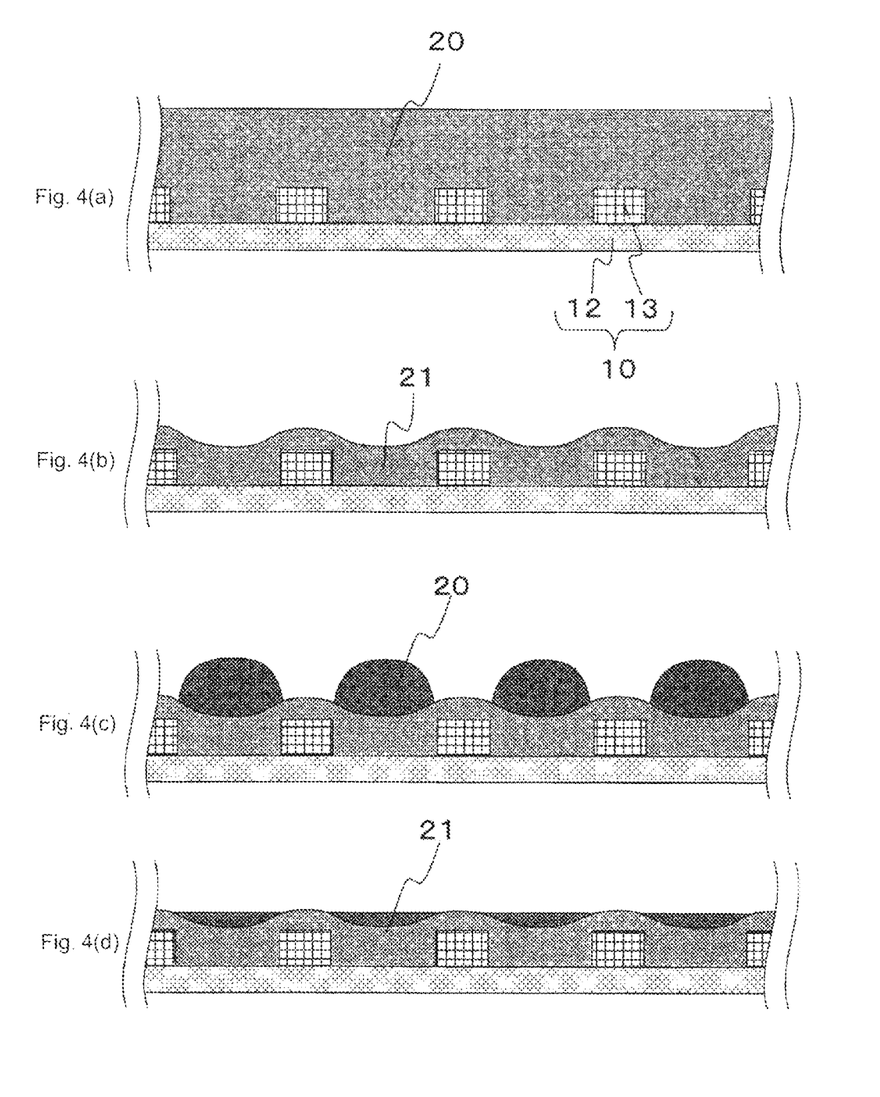

As illustrated in FIG. 4(a), the transparent conductive material-containing solution 20 is coated over the entire surface of the transparent electrode-forming region 11 (see FIG. 1) so as to cover the transparent substrate 10, including the thin wire structure 13 provided thereon. FIG. 4(a) illustrates a state immediately after coating the transparent conductive material-containing solution 20 as a first layer.

It is particularly preferable that the method of forming a film at this time can evenly form a coating film because the film is formed over the entire surface of the transparent electrode-forming region. The method can be selected in an appropriate manner. For example, favorable methods include coating methods, such as spin coating, bar coating, wire bar coating, dip coating, spray coating, slit coating, casting, micro gravure coating, gravure coating, and roll coating.

After that, heat treatment is performed to dry the transparent conductive material-containing solution 20 and evaporate the solvent. Thus, as illustrated in FIG. 4(b), the transparent conductive layer 21 is formed throughout the surface of the transparent substrate 10, including the thin wire structure 13 provided thereon.

Subsequently, as illustrated in FIG. 4(c), the transparent conductive material-containing solution 20 is coated onto the region 14 except for the thin wire structure-forming region in the transparent electrode-forming region 11. FIG. 4(c) illustrates a state immediately after coating the transparent conductive material-containing solution 20 as a second layer.

It is particularly preferable that the method of forming a film at this time can form a pattern. The method can be selected in an appropriate manner. For example, favorable methods include printing methods, such as screen printing, flexographic printing, and offset printing, and injection coating methods, such as ink jet printing and nozzle printing, which are different from those for the first layer.

After that, heat treatment is performed to dry the transparent conductive material-containing solution 20 and evaporate the solvent. As illustrated in FIG. 4(d), the transparent conductive layer 21 is formed throughout the surface of the transparent substrate 10, including the thin wire structure 13 provided thereon. Since the transparent conductive layer 21 is formed of two separately prepared layers, the influence of the shape of the thin wire structure 13 can be reduced and uniformity in the height of the transparent conductive layer 21 is improved. Accordingly, a transparent electrode of high surface smoothness is prepared.

<Advantageous Effects>

The following description sets forth the advantageous effects in the case of using the method for manufacturing a transparent electrode shown in FIGS. 4(a)-4(d).

In the present embodiment, the final layer of the transparent conductive layer 21 is formed in the region 14 except for the thin wire structure-forming region in the transparent electrode-forming region 11. In this case as well, in forming the final layer, the influence of the shape of the thin wire structure 13 can be reduced. Thus, the advantageous effects similar to those of the first embodiment can be obtained. In the present embodiment, the transparent conductive layer 21 is formed only in the region 14 except for the thin wire structure-forming region. Therefore, the amount of the transparent conductive material used is decreased, and thus the advantageous effects similar to those of the first embodiment can be obtained. In the present embodiment, a film can be formed multiple times in the region 14 except for the thin wire structure-forming region. Thus, formation of a film for multiple times until obtaining a desired smoothness, can lead to obtaining particularly greater effects in the improvement of the surface smoothness.

As a matter of course, the detailed structure or the like can be appropriately modified as well.

In a conventional method for forming a transparent conductive layer, for example, an ink that contains a conductive polymeric material is injected or transferred onto a substrate using a coating or printing method. Then, with the evaporation of a solvent contained in the ink, the ink is dried and set, thereby forming a coating film. In these processes, due to the shape of the conductive surface formed of the thin wire structure which is made of a metal and/or an alloy and disposed beneath the coating film, the ink is likely to be adversely affected. Specifically, in the process of drying the ink, the flow of the conductive polymeric material is not likely to be even, resulting in forming a transparent conductive layer with uneven height. Thus, the above method for forming a transparent conductive layer suffers from a problem of impairing the surface smoothness of the transparent electrode.

A transparent electrode having an uneven surface profile may cause the intensity of the electric field applied to the organic EL layer to be uneven, in the case where, for example, the organic EL device uses the transparent electrode. Therefore, the transparent electrode of conventional art has a problem that an emission start voltage or the wavelength of light emitted from the organic EL layer (i.e. chromaticity in light emission) during light emission operation is deviated from a design value, being unable to obtain desired light emission colors, as well as a problem that the organic EL layer (organic EL device) is significantly degraded in a region where the electric field is concentrated, resulting in impairing the reliability of light emission or shortening lifetime.

The present invention has been made in view of the circumstances described above and has an object to provide a method for manufacturing a transparent electrode, a transparent electrode, and an organic EL device provided with the same, which can minimize degradation in the surface smoothness of a transparent electrode caused by uneven height of a transparent conductive layer.

In order to achieve the object, an aspect of the present invention is a transparent electrode including a transparent substrate, a thin wire structure partially covering a surface of the transparent substrate and formed of a conductive material, and a transparent conductive layer formed on the transparent substrate to cover the thin wire structure, characterized in that the transparent conductive layer is formed of two or more layers.

In the above transparent electrode, at least a part of an interface that separates layers of the transparent conductive layer from each other may be formed to be lower than a topmost part of the thin wire structure in a region except for a thin wire structure-forming region that is a region for forming the thin wire structure.

In the above transparent electrode, the interface that separates layers of the transparent conductive layer from each other may have convexities in a thin wire structure-forming region that is a region for forming the thin wire structure, and concavities in a region except for the thin wire structure-forming region, when viewed from a direction parallel to the transparent substrate.

In the above transparent electrode, the transparent conductive layer may include polythiophene, a polythiophene derivative, or a mixture of polythiophene and a polythiophene derivative.

In the above transparent electrode, the transparent conductive layer may include polyaniline, a polyaniline derivative, or a mixture of polyaniline and a polyaniline derivative.

It is preferable that the transparent conductive layer formed of a plurality of separately prepared layers is formed using the same material for all the layers, from the point of improving productivity. However, the layers may be formed of different materials.

In forming the layers, adjusting the viscosity or the tack value of an ink can improve the smoothness.

Another aspect of the present invention is a method for manufacturing a transparent electrode including a transparent substrate, a thin wire structure partially covering a surface of the transparent substrate and formed of a conductive material, and a transparent conductive layer formed on the transparent substrate to cover the thin wire structure, characterized in that the method includes a transparent conductive layer forming step of coating a solution that contains a material for the transparent conductive layer onto the transparent electrode-forming region on the transparent substrate on which the thin wire structure is formed, followed by coating again the solution, at least one time, onto the transparent electrode-forming region to which the solution has been coated.

In the above method for manufacturing a transparent electrode, in the transparent conductive layer forming step, a thin film forming step of drying the solution coated onto the transparent electrode-forming region to form a thin film to be a part of the transparent conductive layer may be performed prior to final coating of the solution.

In the above method for manufacturing a transparent electrode, the transparent conductive layer forming step may include an entire surface coating step of coating the solution over an entire surface of the transparent electrode-forming region, and a partial coating step of coating the solution only onto a region except for a thin wire structure-forming region where the thin wire structure is formed in the transparent electrode-forming region.

In the above method for manufacturing a transparent electrode, in the transparent conductive layer forming step, the partial coating step may be performed first.

In the above method for manufacturing a transparent electrode, in the transparent conductive layer forming step, the partial coating step may be performed last.

In the above method for manufacturing a transparent electrode, the entire surface coating step and the partial coating step may use coating methods different from each other.

Another aspect of the present invention is a transparent electrode manufactured by the method for manufacturing a transparent electrode described above.

Another aspect of the present invention is an organic electroluminescent device including the transparent electrode described above.

In an aspect of the present invention, the transparent conductive layer is formed of two or more separately prepared layers. Consequently, the influence of the shape of the thin wire structure can be reduced in forming the transparent conductive layer. Therefore, the height of the transparent conductive layer can be made uniform, and thus a transparent electrode of high surface smoothness can be obtained. Accordingly, in accordance with an aspect of the present invention, an organic electroluminescent element of high light emission quality and high productivity can be obtained.

The present invention has so far been described with reference to specific embodiments. However, the present invention should not be construed as being limited to the above description. Referring to the description of the present invention, a person skilled in the art will obviously understand the various modifications of the disclosed embodiments as well as other embodiments of the present invention. Therefore, the claims should be construed as also encompassing these modifications or embodiments included in the scope and spirit of the present invention.

REFERENCE SIGNS LIST

10 . . . transparent substrate formed with a thin wire structure
11 . . . transparent electrode-forming region
12 . . . transparent substrate
13 . . . thin wire structure
14 . . . region except for thin wire structure-forming region
20 . . . solution containing materials for transparent conductive layer
21 . . . transparent conductive layer Obviously, numerous modifications and variations of the present invention are possible in light of the above teachings. It is therefore to be understood that within the scope of the appended claims, the invention may be practiced otherwise than as specifically described herein.

What is claimed is:

1. A transparent electrode, comprising:
    a transparent substrate;
    a wire structure which partially covers a surface of the transparent substrate and comprises a conductive material; and
    a transparent conductive layer formed on the transparent substrate and covering the wire structure,
    wherein the transparent conductive layer includes a plurality of layers,
    wherein each layer of the plurality of layers covers the wire structure,
    wherein the plurality of layers of the transparent conductive layer is formed such that at least a portion of an interface that separates the layers from one another is positioned lower than a topmost portion of the wire structure in a region except for a wire structure-forming region that is a region for forming the wire structure,
    wherein when viewed from a direction parallel to the transparent substrate, at least two layers of the plurality of layers have different thicknesses in the wire structure-forming region, and
    wherein when viewed from a direction parallel to the transparent substrate, an interface that separates layers of the transparent conductive layer from one another has convexities in a wire structure-forming region that is a region for forming the wire structure, and concavities in a region except for the wire structure-forming region.

2. The transparent electrode according to claim 1, wherein the transparent conductive layer includes polythiophene, a polythiophene derivative, or a mixture of polythiophene and a polythiophene derivative.

3. The transparent electrode according to claim 1, wherein the transparent conductive layer includes polyaniline, a polyaniline derivative, or a mixture of polyaniline and a polyaniline derivative.

4. An organic electroluminescent device, comprising:
    the transparent electrode according to claim 1.

5. The transparent electrode according to claim 1, wherein when viewed from a direction parallel to the transparent substrate, at least two layers of the plurality of layers have a thinnest portion in the wire structure-forming region.

6. A method for manufacturing the transparent electrode including a transparent substrate, a wire structure which partially covers a surface of the transparent substrate and comprises a conductive material, and a transparent conductive layer formed on the transparent substrate and covering the wire structure, wherein the transparent conductive layer includes a plurality of layers, wherein each layer of the plurality of layers covers the wire structure, wherein the plurality of layers of the transparent conductive layer is formed such that at least a portion of an interface that separates the layers from one another is positioned lower than a topmost portion of the wire structure in a region except for a wire structure-forming region that is a region for forming the wire structure, wherein when viewed from a direction parallel to the transparent substrate, at least two layers of the plurality of layers have different thicknesses in the wire structure-forming region, and wherein when viewed from a direction parallel to the transparent substrate, an interface that separates layers of the transparent conductive layer from one another has convexities in a wire structure-forming region that is a region for forming the wire structure, and concavities in a region except for the wire structure-forming region, comprising:

forming the transparent conductive layer, which includes
coating a solution that includes a material for the transparent conductive layer onto a transparent electrode-forming region on the transparent substrate on which the wire structure is formed, and
re-coating the solution, at least one time, onto the transparent electrode-forming region to which the solution has been coated.

7. The method according to claim 6, wherein the forming of the transparent conductive layer includes drying the solution coated onto the transparent electrode-forming region such that a film is formed to be a portion of the transparent conductive layer, and the drying is performed prior to a final coating of the solution.

8. The method according to claim 6, wherein when viewed from a direction parallel to the transparent substrate, at least two layers of the plurality of layers have a thinnest portion in the wire structure-forming region.

9. An organic electroluminescent device, comprising:
a transparent electrode including a transparent substrate, a wire structure which partially covers a surface of the transparent substrate and comprises a conductive material, and a transparent conductive layer formed on the transparent substrate and covering the wire structure, wherein the transparent conductive layer includes a plurality of layers, wherein each layer of the plurality of layers covers the wire structure, wherein the plurality of layers of the transparent conductive layer is formed such that at least a portion of an interface that separates the layers from one another is positioned lower than a topmost portion of the wire structure in a region except for a wire structure-forming region that is a region for forming the wire structure, wherein when viewed from a direction parallel to the transparent substrate, at least two layers of the plurality of layers have different thicknesses in the wire structure-forming region, and wherein when viewed from a direction parallel to the transparent substrate, an interface that separates layers of the transparent conductive layer from one another has convexities in a wire structure-forming region that is a region for forming the wire structure, and concavities in a region except for the wire structure-forming region.

10. The organic electroluminescent device according to claim 9, wherein when viewed from a direction parallel to the transparent substrate, at least two layers of the plurality of layers have a thinnest portion in the wire structure-forming region.

* * * * *